(12) United States Patent
Eurlings et al.

(10) Patent No.: US 6,833,907 B2
(45) Date of Patent: Dec. 21, 2004

(54) ILLUMINATOR FOR A LITHOGRAPHY APPARATUS, A LITHOGRAPHY APPARATUS COMPRISING SUCH AN ILLUMINATOR, AND A MANUFACTURING METHOD EMPLOYING SUCH A LITHOGRAPHY APPARATUS

(75) Inventors: Markus F Eurlings, Breda (NL); Jan J Krikke, Best (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/464,667

(22) Filed: Jun. 19, 2003

(65) Prior Publication Data

US 2003/0214643 A1 Nov. 20, 2003

Related U.S. Application Data

(63) Continuation of application No. 09/733,959, filed on Dec. 12, 2000, now Pat. No. 6,671,035.

(30) Foreign Application Priority Data

Dec. 13, 1999 (EP) .............................. 99310026

(51) Int. Cl.[7] .................. G03B 27/72; G03B 27/42
(52) U.S. Cl. ........................................ 355/71; 355/53
(58) Field of Search ............................. 355/52, 53, 55, 355/67–71; 356/399–401; 250/548

(56) References Cited

U.S. PATENT DOCUMENTS

| | | |
|---|---|---|
| 3,729,252 A | 4/1973 | Nelson |
| 3,782,804 A | 1/1974 | Kanazawa et al. |
| 4,444,456 A | 4/1984 | Jain et al. |
| 4,450,358 A | 5/1984 | Reynolds |
| 4,547,037 A | 10/1985 | Case |
| 5,264,898 A | 11/1993 | Kamon et al. |
| 5,638,211 A | 6/1997 | Shiraishi |
| 5,675,401 A | 10/1997 | Wangler et al. |
| 5,850,300 A | 12/1998 | Kathman et al. |
| 6,049,374 A | 4/2000 | Komatsuda et al. |
| 6,211,944 B1 | 4/2001 | Shiraishi |
| 6,252,647 B1 | 6/2001 | Shiraishi |
| 6,259,512 B1 * | 7/2001 | Mizouchi ................. 355/67 |
| 6,259,513 B1 * | 7/2001 | Gallatin et al. ............ 355/71 |
| 6,285,443 B1 * | 9/2001 | Wangler et al. ............ 355/67 |
| 6,304,317 B1 | 10/2001 | Taniguchi et al. |
| 6,392,742 B1 * | 5/2002 | Tsuji ........................ 355/67 |
| 6,403,285 B1 | 6/2002 | Holscher et al. |
| 6,452,662 B2 * | 9/2002 | Mulkens et al. ............ 355/67 |
| 6,563,567 B1 * | 5/2003 | Komatsuda et al. ......... 355/71 |

FOREIGN PATENT DOCUMENTS

| | | |
|---|---|---|
| EP | 0 486 316 A2 | 5/1992 |
| EP | 0 486 316 A3 | 5/1992 |
| EP | 0 949 541 A3 | 10/1999 |
| EP | 0 949 541 A2 | 10/1999 |
| JP | 11-54426 | 2/1999 |
| JP | 3 209 218 | 9/2001 |

* cited by examiner

Primary Examiner—Henry Hung Nguyen
(74) Attorney, Agent, or Firm—Pillsbury Winthrop LLP

(57) ABSTRACT

An illuminator for controlling a beam of radiation for a lithographic projection apparatus includes a plurality of optical elements and an exchanger for inserting and removing the optical elements from the beam path. The intensity distribution of the beam at a pupil plane of the illuminator is determined by the optical elements. Different illumination settings (intensity distributions) can be obtained by the exchanger swapping between different optical elements, without the need for a zoom-axicon module.

20 Claims, 5 Drawing Sheets

ILLUMINATOR FOR A LITHOGRAPHY APPARATUS, A LITHOGRAPHY APPARATUS COMPRISING SUCH AN ILLUMINATOR, AND A MANUFACTURING METHOD EMPLOYING SUCH A LITHOGRAPHY APPARATUS

This application is a Continuation of U.S. application Ser. No. 09/733,959, filed Dec. 12, 2000 now U.S. Pat. No. 6,671,035, which claims priority from European Patent application No. 99310026.2, filed Dec. 13, 1999, the contents of which are incorporated herein by reference.

BACKGROUND OF THE INVENTION

1. Field of the Invention

The present invention relates to an illumination system for a lithography apparatus, such as may be used to produce an illumination beam of radiation and in which the intensity distribution of a beam of radiation at a plane is controlled. More particularly, the invention relates to the use of the illumination system in a lithographic projection apparatus comprising:

a radiation system comprising an illumination system, for supplying a projection beam of radiation;

patterning means, for patterning the projection beam according to a desired pattern;

a substrate table for holding a substrate; and a projection system for imaging the patterned beam onto a target portion of the substrate.

2. Description of the Related Art

The term "patterning means" should be broadly interpreted as referring to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device (see below). Examples of such patterning means include:

A mask table for holding a mask. The concept of a mask is well known in lithography, and its includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. The mask table ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference.

A programmable LCD array. An example of such a construction is given in U.S. Pat. No. 5,229,872, which is incorporated herein by reference.

For the sake of simplicity, the rest of this text may, at certain locations, specifically direct itself to examples involving a mask table and mask; however, the general principles discussed in such instances should be seen in the broader context of the patterning means as hereabove set forth.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables and/or two or more mask tables. In such "multiple stage" devices the additional tables may be used in parallel, or preparatory steps may be carried out on one or more tables while one or more other tables are being used for exposures. Twin stage lithographic apparatus are described in, for example, U.S. Pat. No. 5,969,441 and U.S. Pat. No. 09/180,011, filed Feb. 27, 1998, incorporated herein by reference.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (comprising one or more dies) on a substrate (silicon wafer) which has been coated with a layer of photosensitive material (resist). In general, a single wafer will contain a whole network of adjacent target portions which are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—which is commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

A projection apparatus, such as used in lithography, generally includes an illumination system, referred to hereafter simply as an illuminator. The illuminator receives radiation from a source, such as a laser, and produces an illumination beam for illuminating an object, such as the patterning means (e.g. a mask on a mask table). Within a typical illuminator, the beam is shaped and controlled such that at a pupil plane the beam has a desired spatial intensity distribution. This spatial intensity distribution at the pupil plane effectively acts as a virtual radiation source for producing the illumination beam. Following the pupil plane, the radiation is substantially focussed by a lens group referred to hereafter as "coupling lens". Said coupling lens couples the substantially focussed light into an integrator, such as a quartz rod. The function of said integrator is to improve the homogeneity of both the spatial and angular intensity distribution of the illumination beam. The spatial intensity distribution at the pupil plane is converted to an angular intensity distribution at the object being illuminated by said coupling optics, because the pupil plane substantially coincides with the front focal plane of the coupling optics. Controlling the spatial intensity distribution at the pupil plane can be done to improve the processing parameters when an image of the illuminated object is projected onto a substrate.

A known illuminator comprises an optical system referred to hereafter as "zoom-axicon". The zoom-axicon is a means for adjusting the intensity distribution at the pupil plane. Radiation from the source passes through a first optical component, which generates an angular intensity distribution. Next, the radiation beam traverses a zoom lens. In the back focal plane of the zoom lens a spatial intensity distribution occurs that generally is suitable to serve as a secondary light source in the pupil plane. Hence, the back focal plane of the zoom lens typically substantially coincides with the pupil plane (i.e., the front focal plane of the coupling optics). The outer radial extent of the spatial intensity distribution at the pupil plane can be changed by changing the focal length of the zoom lens. However, the zoom lens must have two degrees of freedom, one to change the focal length of the zoom lens and a second to change the position of the principal planes such that when the focal length changes, the back focal plane remains located at the pupil plane of the illuminator. Due to this functionality, the zoom lens typically consists of several (e.g. at least three) separate lenses in series, several of which are movable. As mentioned above, by tuning the focal length of the zoom lens, the radial extent of the disc-shaped, preferably homogeneous, intensity distribution at the pupil plane can be set. In the following, any preselected, preferred spatial intensity distribution at the pupil plane may be referred to as an "illumination setting".

An axicon, which is located near the pupil plane, generally consists of two elements having complimentary conical shaped faces. Said axicon is used to generate annular spatial intensity distributions, or other spatial intensity distributions with substantially no intensity around their centre, i.e. no on-axis illumination. By tuning the distance between the two conical faces of the axicon, the annularity can be adjusted. When the axicon is closed, i.e. the gap between the conical faces is zero, conventional (i.e. said disc-like) illumination settings can be produced. With a gap between the conical faces, an annular intensity distribution results, with the inner radial extent of the annulus determined by the distance between the two conical faces; on the other hand the zoom lens determines the outer radial extent and thus the width of the annulus. Preselected inner -and outer radial extents of the intensity distribution are often referred to as σ-settings, in particular the σ-inner setting and the σ-outer setting, respectively. Here, σ-inner and σ-outer are a measure for the ratio of the radius in question to the maximum radius of the pupil.

The term "zoom-axicon" as employed here should be interpreted as referring to a module comprising said zoom lens and said axicon.

Multipole illumination settings can be generated by various means in the known illuminator, for example by modifying said first optical element in front of the zoom lens, such as to appropriately shape the angular intensity distribution, or by inserting aperture plates or blades into the beam path, for instance near the pupil plane, and so on. Further information on a known zoom-axicon module and multipole mode generation are given in U.S. Ser. No. 09/287,014, filed Apr. 6, 1999, now U.S. Pat. No. 6,452,662, incorporated herein by reference.

In the known illuminator, described above, it is apparent that to produce the desired range of illumination settings the zoom-axicon module will generally have several (e.g. five or more) optical components, which can make it expensive to produce, particularly given the fact that several of the elements must be independently movable. A further problem is that the lenses comprising the zoom lens and the two conical elements of the axicon represent a considerable thickness of lens material and a large number of surface interfaces. This means that the transmission efficiency can be poor due to absorption, inefficient coatings, degradation effects and contamination. This problem is exacerbated by the demand for imaging ever smaller features at higher densities, which requires the use of radiation with shorter wavelengths, such as 193, 157, 126 nm. The efficiency of suitable transmissive materials, such as $CaF_2$ and quartz, generally decreases at shorter wavelengths due to increased absorption. The effectiveness of the optical coatings of the components also typically decreases at shorter wavelengths and degradation effects generally become worse. Thus, overall, a significant throughput reduction can occur, due to decreased transmission. Another problem is that the known illuminator occupies a relatively large volume in the lithography apparatus. This in turn can lead to excess bulk in the machine, and increased manufacturing costs (particularly when using material such as $CaF_2$).

SUMMARY OF THE INVENTION

An object of the present invention is to provide an improved lithography apparatus with an illuminator which avoids or alleviates the above problems.

According to one aspect of the present invention, there is provided a lithography apparatus as specified in the opening paragraph, characterized in that said adjusting means consist of at least one exchanger for inserting and removing at least one of a plurality of optical elements into and out of the projection beam path, each of the said optical elements defining at least one parameter of said intensity distribution.

The term "optical element" as employed here should be interpreted as referring to elements such as a diffractive optical element (e.g. comprising an array of diffractive microlenses), referred to hereafter as a "DOE", a microlens array, a holographic optical element (e.g. comprising an array of computer generated holographic optical subelements, etc. Further information on DOEs is given, for example, in U.S. Pat. No. 5,850,300, incorporated herein by reference. Said elements are generally relatively thin and can be made, for example, on a substantially plane-parallel substrate.

The use of an exchanger and a plurality of optical elements enables the illumination setting of the apparatus to be changed, but without requiring a zoom-axicon module. Elimination of the zoom-axicon module and replacement of this module by a single lens greatly reduces the number of optical components in the illuminator, which reduces the number of surfaces and decreases the thickness of transmissive material necessary, and so significantly improves the initial throughput. Elimination of the zoom-axicon module also lowers the sensitivity of the illuminator to degradation and contamination effects, and can enable the costs of the apparatus to be reduced. Also the size of the apparatus can be reduced.

An apparatus according to the above aspects of the invention can also have the following advantage. In conventional illuminators, the relative complexity and placement accuracy of the optical components can cause an undesired ellipticity in the pupil intensity distribution. However, the relatively simple construction of the present illuminator alleviates this problem.

In a particular embodiment of the invention the position along the beam path of said optical element(s) and the position of said pupil generating lens are adjustable. This enables some continuous variation of the intensity distribution parameters, such as the inner and outer radial extent, to be achieved. This can be used to eliminate the discrete nature of the parameters of the intensity distribution provided by the optical elements or to reduce the number of interchangeable optical elements which need to be provided for the exchanger.

According to one embodiment, at any one time, a single optical element is present in the beam path (after initial beam expansion) and defines a set of parameters of the intensity distribution. The exchanger can swap the optical element for one of a number of different optical elements, each for defining a different illumination setting. This arrangement can be advantageous because the smaller the number of optical elements in the beam, the less the beam is attenuated. This is particularly advantageous for microlens arrays and other optical elements such as DOEs, which are optically thin and relatively inexpensive to manufacture, so it is not a problem to provide a library of different exchangeable optical elements, one for each desired illumination setting.

In an alternative scenario, the exchanger is embodied so as to be able to position at least two of the said optical elements in parallel (i.e. side by side) in the beam path. Alternatively, a single such optical element can be embodied in such as way as to contain a plurality of zones, each zone corresponding to a different type of illumination setting, and the apparatus can be embodied so as to be able to direct the beam through one or more different zones of the said element. For example, the exchanger in the latter scenario may be able to enact fine x,y-motion in a plane parallel to that of the optical element, thus allowing the beam to be finely positionable (in an x,y-plane) with respect to the element; alternatively, optical splitters/mixers may be used to direct different portions of the beam through different zones, or different areas of a single zone, or separate elements, at pre-selected ratios. All of these scenarios have in common the fact that they allow a great(er) plurality of illumination settings to be achieved on the basis of a relatively small number of the said optical elements, by virtue of the efficient "mixing effects" described above. Moreover, one is enabled in this manner to create (variable) illumination settings that would otherwise be difficult, or impossible, to achieve. One can even contemplate varying an illumination setting during an actual exposure.

Specific examples of "hybrid" illumination settings that can be generated in the matter described in the previous paragraph include:

"soft multipole", where a multipole pattern is generated by a first element (or zone, or area of a zone) and a background flux is generated by a second element (or zone, or area of a zone);

a quadrupole pattern comprising a "strong" dipole in the x-direction and a "weak" dipole in the y-direction;

a "staggered quadrupole" pattern, wherein the pole spacing in the x-direction is different to that in the y-direction.

It should be noted that the embodiment described in the previous two paragraphs is not limited in its use to an illuminator in which a zoom-axicon is absent, and replaced by a single lens. In situations where the material costs, absorption issues and/or bulk of the zoom axicon are not a substantial issue (e.g. in DUV lithography, or "high-end" machines for use at 193 nm or 157 nm), this "mixing embodiment" might be used in combination with a zoom-axicon, for added flexibility.

In another embodiment of the invention, several of said optical elements are arrangeable in series along the beam path. In one embodiment, a first optical element defines a particular sub-set of parameters of the intensity distribution and a second optical element defines for instance a particular change of said sub-set of parameters. For instance, a first optical element can define a certain preselected annularity defined by an inner and outer radial extent (the σ settings; respectively the σ-inner setting and the σ-outer setting) of the intensity distribution, and a second optical element can have the effect of reducing and increasing (by a preselected amount) said inner and outer radial extent, respectively. This has the advantage that, by placing preselectable combinations of different optical elements in series in the optical path (including the combination of an optical element in one exchanger and an open position in an other exchanger), the number of illumination settings can be increased while minimizing the number of optical elements required. Such an embodiment may comprise several (e.g. two) exchangers in series. The use of, for example, microlens arrays or DOEs as the optical elements is advantageous because generally they are relatively thin and, therefore, even with several of them in series, the degree of light absorption compared with a zoom-axicon module is greatly reduced.

According to a further aspect of the invention there is provided a device manufacturing method comprising the steps of:

providing a substrate that is at least partially covered by a layer of radiation-sensitive material;

providing a projection beam of radiation using an illumination system;

using patterning means to endow the projection beam with a pattern in its cross-section;

projecting the patterned beam of radiation onto a target area of the layer of radiation-sensitive material, characterized by:

setting the inner and/or outer radial extent of the intensity distribution of the projection beam using at least one exchanger to position at least one of a plurality of optical elements in the projection beam path, the or each such optical element defining at least one parameter of said intensity distribution.

In a manufacturing process using a lithographic projection apparatus according to the invention a pattern (e.g. in a mask) is imaged onto a substrate that is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

In the present document, the terms illumination radiation and illumination beam are used to encompass all types of electromagnetic radiation, including ultraviolet radiation (e.g. with a wavelength of 365, 248, 193, 157 or 126 nm) and EUV.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION OF THE INVENTION

Figure 1:
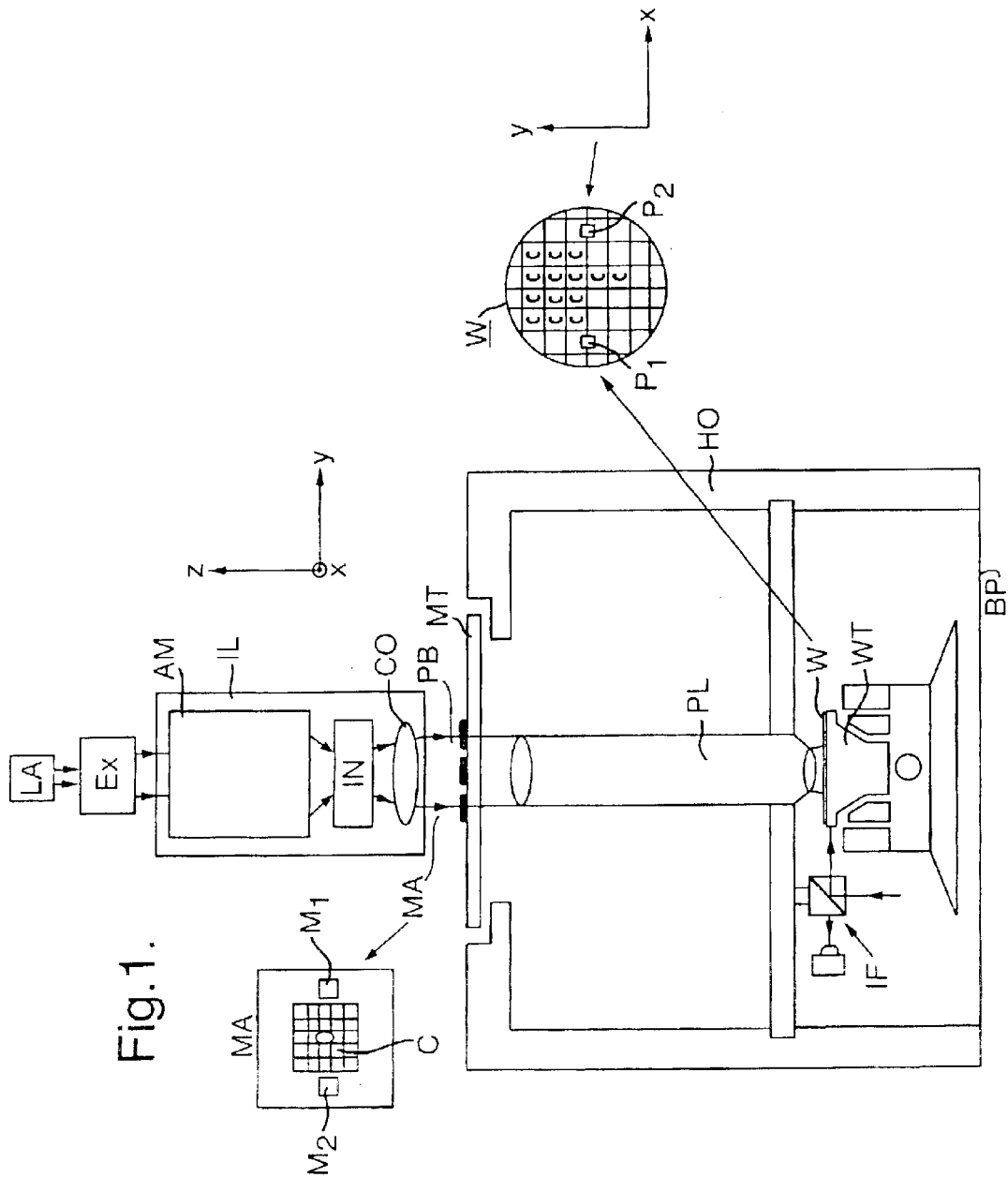
FIG. 1 depicts a lithographic projection apparatus according to an embodiment of the invention.

FIG. 1 schematically depicts a lithographic projection apparatus according to a particular embodiment of the invention. The apparatus comprises:

- a radiation system LA, Ex, IL, for supplying a projection beam PB of radiation (e.g. UV or EUV radiation);
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive or catadioptric system, or a mirror group) for imaging an irradiated portion of the mask MA onto a target portion C (comprising one or more dies) of the substrate W.

As here depicted, the apparatus is of a transmissive type (i.e. has a transmissive mask). However, in general, it may also be of a reflective type, for example (with a reflective mask).

The radiation system comprises a source LA (e.g. a Hg lamp, or an excimer laser) which produces a beam of radiation. This beam is fed into an illumination system IL, either directly or after being passed through conditioning means, such as a beam expander Ex, for example. The illuminator IL comprises adjusting means AM for setting the outer and/or inner radial extent (i.e. σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA which is held in a mask holder on a mask table MT. Having traversed the mask MA, the beam PB passes through the lens PL, which focuses the beam PB onto a target portion C of the substrate W. With the aid of the interferometric displacement and measuring means IF, the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long stroke module (course positioning) and a short stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
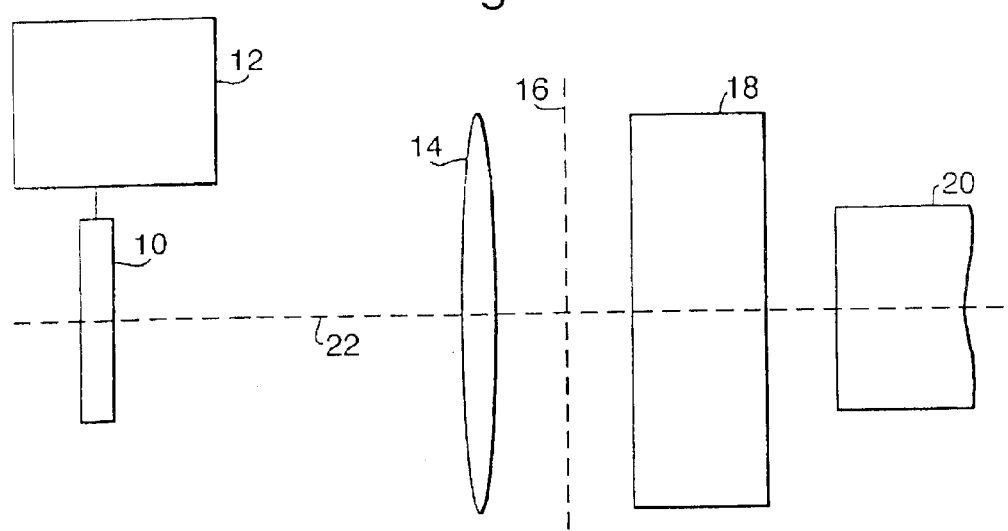
FIG. 2 is an illustration of part of an illuminator according to the present invention.

An embodiment of an illuminator according to the invention is shown in FIG. 2. It comprises an optical element 10 in the beam path (broken line) and an optical element exchanger 12 having access to other optical elements that can be substituted for optical element 10 in the beam path. The exchanger 12 may comprise any suitable means for inserting and removing the optical elements from the beam path, such as a carousel or rotatable disc provided with several optical elements and controllable to position a selected one of the optical elements in the beam path, or a "slide-in-slide-out" mechanism, as employed in a photographic slide projector, for example.

Radiation passing through the optical element 10 is condensed by a single lens 14 to produce a spatial intensity distribution at the pupil plane 16. In an alternative embodiment, the lens 14 is compound, but all its components are fixed, as opposed to the situation in a zoom-axicon. The pupil plane is located at the back focal plane of lens 14. The choice of optical element 10 determines the intensity distribution (i.e. illumination setting) of the illuminator. Each exchangeable optical element 10 defines a particular intensity distribution having a set of parameters such as inner and outer radii and beam shape.

In this embodiment the single fixed lens 14 and the plurality of optical elements 10 replace the various (movable) lenses and the two complementary conical components of a zoom-axicon module. After the lens 14, the radiation is coupled by a coupling lens 18 into an integrator rod 20 (or fly-eye lens, for example). The axial location of coupling lens 18 is chosen such that its front focal plane substantially coincides with the pupil plane 16. This embodiment, in which an optical element is used to define completely the intensity distribution at the pupil plane, has no negative impact on performance, as measured by beam characteristics such as uniformity, telecentricity and the intensity distribution at the entrance to the integrator 20.

The optical element 10 is generally a thin element, such as an array of microlenses or a DOE.

In a particular embodiment the optical element is a DOE comprising an array of substantially identical diffractive optical microlenses functioning like Fresnel lenses, where the difference between the maximum (axial) thickness of one portion and the minimum thickness of a neighboring portion of the Fresnel lens is controlled with an accuracy of the order of the wavelength of the radiation beam (e.g. 248 nm, or 193 nm). In classical, refractive, Fresnel lenses said accuracy is generally not maintained. The term "Fresnel lens" as employed here should generally be interpreted as referring to said diffractive optical microlenses constituting a DOE. The Fresnel lens array can be fabricated using a lithographic process, for example. Gradual variation in thickness of different regions on the surface of the Fresnel lens can be approximated as a staircase, typically using about eight steps (or phase levels) i.e. using eight layers in the process used to manufacture the array.

The principal illumination settings (intensity distributions at the pupil plane of the illuminator) that one may generally wish to produce are: so-called conventional settings, annular settings, and multipole settings. Different optical elements can be fabricated to generate each of these settings as discussed below.

Conventional settings, i.e. simple uniform disc-like intensity distributions, can be created simply by embodying each Fresnel lens of the DOE to produce a divergent beam from the incoming radiation beam. The angular intensity distribution produced by the optical element is converted by lens 14 (FIG. 2) to a spatial intensity distribution at the pupil plane. The only parameter of this illumination setting is the outer radial extent of the spatial intensity distribution at the pupil plane. Decreasing the effective radius of curvature of the Fresnel lenses or increasing the size of the individual Fresnel lenses will increase the divergence of the beam, and therefore increase the maximum radial extent of the spatial intensity distribution. The shape of a Fresnel lens in the plane perpendicular to the optical axis of the Fresnel lens determines the shape of the spatial intensity distribution at the pupil plane. Thus, for a disc-shaped distribution, the Fresnel lenses should have a disc-like shape. To allow for a dense packing of the Fresnel lenses constituting a DOE, the said shape can be chosen to be hexagonal, such as to approximate a disc-like shape. A selection of different optical elements can be provided to give a number of conventional illumination settings. Optical elements used for the realization of conventional settings as described here may be referred to as "conventional optical elements" hereafter.

Figure 3:
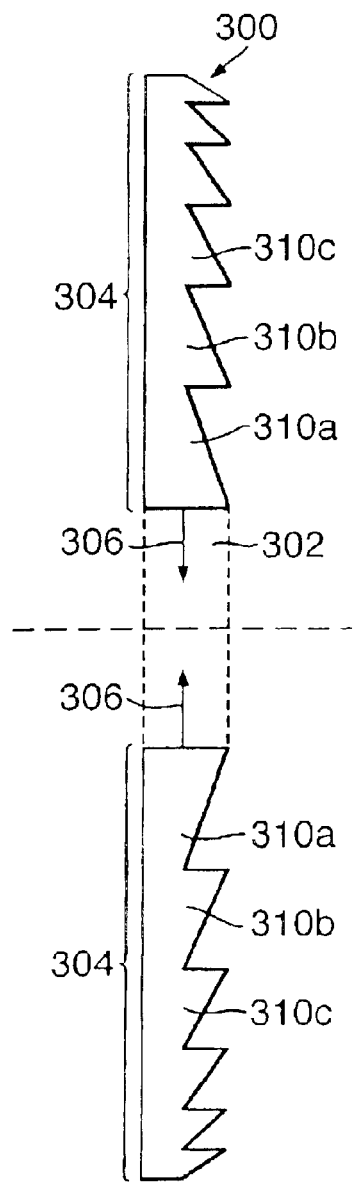
FIG. 3 illustrates in cross-section, a Fresnel lens for use in a diffractive optical element, for the situation where annular illumination is to be generated.
Figure 4:
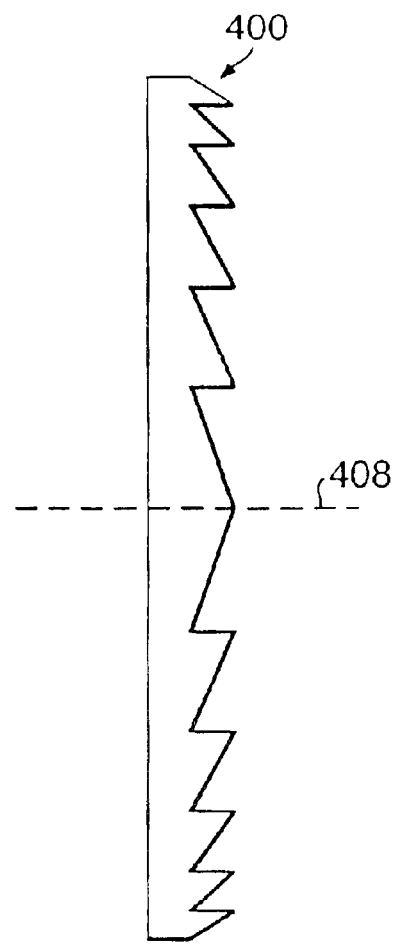
FIG. 4 illustrates in cross-section a modified Fresnel lens for use in a diffractive optical element with improved efficiency, for the situation where annular illumination is to be generated.

Annular illumination settings are characterized by the absence of light at the centre part of the pupil plane. A parameter of this illumination setting is the inner radial extent, i.e. the extent of the absence of light at the centre part. With a conventional optical element the centre part of the intensity distribution at the pupil is generated by the centre part of each Fresnel lens. So in order to produce annular illumination, the centre part of each Fresnel lens of a conventional optical element must be eliminated. FIGS. 3 and 4 illustrate conceptually how an optical element for producing annular illumination settings can be designed. FIG. 3 shows a single Fresnel lens 300 of a conventional optical element in cross-section, with the inner Fresnel rings removed from the region indicated by the dotted box 302. One could simply block the radiation from passing through the inner Fresnel rings, but this would reduce the efficiency; therefore, the remaining outer group 304 of Fresnel rings 310a, 310b, . . . , are instead effectively shifted radially inwards as indicated by the arrows 306 in FIG. 3. The resulting Fresnel lens 400 is shown schematically in cross-section in FIG. 4, and is of course axially symmetric, the axis being the dashed line 408 in FIG. 4. The inner radial extent of the annulus produced by such an array of Fresnel lenses is determined by the number of inner Fresnel rings that have effectively been removed, and the outer radial extent of the annulus can be determined in the same way as for conventional illumination modes.

In multipole illumination modes, such as dipole or quadrupole, each pole in the pupil plane can be considered as being just a part of an annular intensity distribution in said plane. An optical element to generate multipole settings can comprise an array of Fresnel lenses with each Fresnel lens shaped according to the pole shape in the pupil plane to which the Fresnel lens is directing radiation intensity.

Although described above in terms of Fresnel lens arrays, the optical elements can take other forms, such as arrays of computer-generated holograms (Fourier-calculated image-generating pattern plates), for example.

A particular embodiment of the invention, at least one of the optical elements provided for the optical element exchanger can be used to achieve a conventional illumination setting with particularly small sigma setting (i.e. small outer radial extent). Such a setting is particularly advantageous for use with phase-shift masks.

According to the above described scenario, a unique optical element 10 is required for each illumination setting, and the parameters of the illumination setting cannot be continuously varied, but will change discretely when one optical element is exchanged for a different optical element. According to a further embodiment of the invention, the optical element 10 and lens 14 are both movable along the optical axis 22 of the illuminator. Studies indicate that a simultaneous movement of the optical element 10 and lens 14 in FIG. 2 result, for the case of conventional illumination, in an effective change of the radial extent of the intensity distribution at the pupil plane. For instance, when they are both moved towards the integrator 20, the effective radial extent of the intensity distribution at the pupil plane 16 becomes smaller, i.e. the outer radial extent (or σ-outer setting) is reduced. Thus, in this way some continuous variation in the settings can be obtained. Studies indicate that changes in σ-outer of about 0.25 or 0.3 are typically achievable.

It will of course be appreciated that when the lens 14 is moved axially, the pupil plane 16 is no longer at the front focal plane of coupling lens 18. Therefore the intensity distribution at the entrance to the integrator 20 may become less uniform. This can be corrected to some extent, or tolerated in exchange for the extra flexibility given by the "zoom" function achievable by adjusting the axial position of the optical element 10 and lens 14.

In a preferred embodiment, the lens 14 has a focal length of the order of 1000 mm and the optical element 10 and lens 14 can be shifted of the order of 350 mm along the optical axis 22 towards and away from the integrator 20.

According to the above embodiments, a single optical element is used to define the intensity distribution at the pupil plane 16 and an exchanger 12 can swap the particular optical element 10 for different optical elements so as to change the intensity distribution. This enables the zoom axicon module to be eliminated and a single lens element 14 to be used instead. The throughput efficiency of an illuminator is of course sensitive to the volume absorption coefficients of the $CaF_2$ and quartz typically used in the optical components, and in the surface coating efficiencies. However, analysis shows that an illuminator using a zoom-axicon module may have an efficiency in the region of 55 to 75%, whereas an illuminator according to the above described embodiments can have an efficiency of between 80 and 85%, which represents a considerable efficiency improvement.

In one form of illumination, the poles of the intensity distribution, such as for a multipole mode, have essentially zero intensity between them, which has been termed a "hard" multipole mode. However, in certain applications it is advantageous to have some radiation intensity between the poles or on the optical axis, and these variants are generally called "soft" multipole modes. Examples of soft illumination settings would be: providing an overall background radiation intensity; providing a central weak pole; and providing a number of weak intensity poles other than the main poles. The soft variants, such as those mentioned above, may also be used with conventional and annular illumination settings. Such soft variants can be considered as being mixtures of several (e.g. at least two) pupil intensity distributions representing the aforementioned principal illumination settings.

In the following, we will refer to a "soft illumination setting" as a mixture of several (e.g. at least two) different pupil intensity distributions, where these pupil intensity distributions may include, but are not limited to, the said principal illumination settings. For reference, we will identify said principal illumination settings and the corresponding microlens or Fresnel lens shapes (as occurring respectively in microlens arrays or DOEs) by a letter, as indicated in the table below.

| letter | principal illumination setting |
|---|---|
| O | conventional |
| N | quadrupole |
| E | dipole, axis through the center of the poles is parallel to the x-axis |
| W | dipole, axis through the center of the poles is parallel to the y-axis |
| S | annular |

The x -and y-directions referred to here are located in a plane substantially perpendicular to the local optical axis. In many embodiments, the directions of the x -and y-axes will substantially correspond to mutually orthogonal directions of critical line structures in a patterning mask.

Optical elements for producing soft illumination settings may also be used with the present invention. In one embodiment a single DOE for generating a soft illumination setting would consist of an array of Fresnel lenses, where for instance two types of Fresnel lenses are distributed over the array. For instance, a DOE generating a soft quadrupole intensity distribution might feature 50% of the array filled with Fresnel lenses of type N and 50% of the array filled with Fresnel lenses of another type, e.g. of type O. Other ratios, i.e., other percentages, can of course be used as well.

Figure 5:
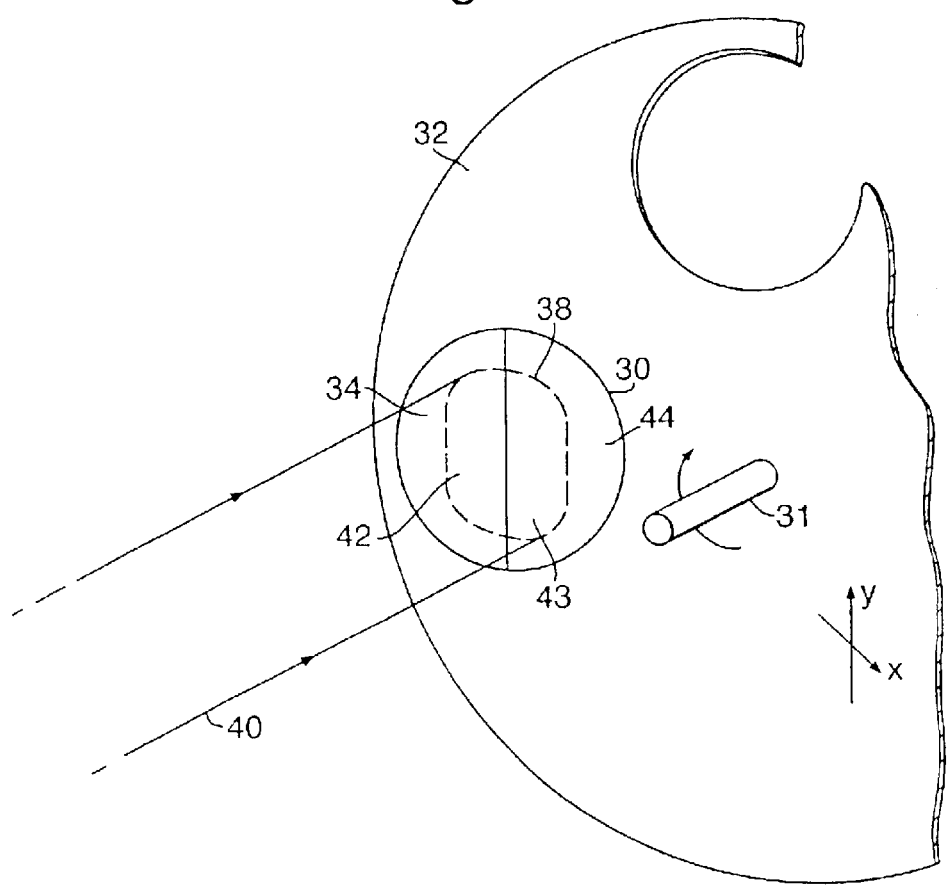
FIG. 5 illustrates an exchanger provided with an optical element that can be used to generate a soft illumination setting, the exchanger being movable such as to vary the softness of the illumination setting.

In another embodiment of the invention, soft illumination is obtained by positioning two DOEs side by side in the radiation beam, at the location of element 10 in FIG. 1, in such a way that both DOEs are partially irradiated by the incoming radiation beam; see FIG. 5. In FIG. 5 such a side-by-side set up at a location 30 in a carrousel 32 is shown. The carrousel (part of the exchanger 12 in FIG. 1) is rotatable around the axis 31, and laterally movable in mutually orthogonal directions x and y, substantially perpendicular to the axis 31. A DOE for conventional illumination, comprising Fresnel lenses of type O, and shown as element 34 in FIG. 5, is placed side by side with a DOE for annular illumination, comprising Fresnel lenses of type S, and shown as element 44. The footprint 38 of the incoming radiation beam 40 intercepts both DOEs partially. Therefore, the resulting spatial intensity distribution at the pupil plane will be a sum of conventional disc-shaped and annular shaped intensity distributions. Clearly, the ratio of the irradiated areas 42 and 43 in FIG. 5 determines the ratio of said conventional and annular intensity distributions. By moving the carrousel 32 in the x-direction, as shown in FIG. 5, this ratio can be controlled and adjusted to any desired preselected value. This way, it is possible to establish an optimal ratio for a specific imaging application without the need of having access to a large number of single-element soft-annular DOEs.

Figure 6:
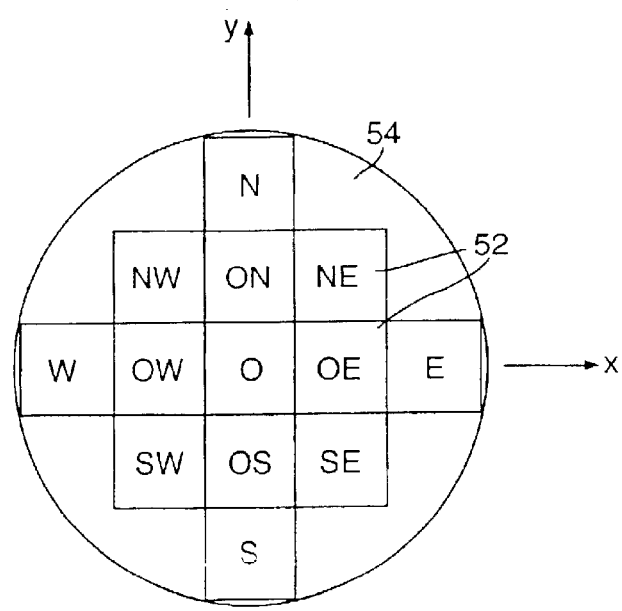
FIG. 6 depicts an optical element which, when placed in the radiation beam, can be used to generate a plurality of illumination settings, dependent on the relative lateral position of the element in the radiation beam.

In another embodiment, considerable flexibility in creating different illumination settings is obtained by the use of a single optical element 54 comprising a plurality of zones 52, as shown in FIG. 6, where each zone is, for instance, a DOE portion which generates a specific illumination mode. FIG. 6 indicates in each zone the types of Fresnel lenses occurring (see also the table above). Thus, zone N is a DOE portion whose array of diffractive microlenses consists 100% of Fresnel lenses of type N, generating quadrupole illumination, and zone OS is a DOE portion described above for generating soft annular illumination. By placing this optical element in position 30 in FIG. 5 and exploiting the possibility of moving this optical element 54 (e.g. in the x-and/or y-directions) relative to the footprint 40 of the radiation beam, one can create a plurality of soft illumination settings as well as principal illumination settings. It should be noted that FIG. 6 only illustrates the embodiment schematically. For instance, the number of zones, the ratios of Fresnel lens types occurring in each zone, and the size of the footprint 40 with respect to the size of a zone, are all parameters that can be suitably chosen.

Figure 7:
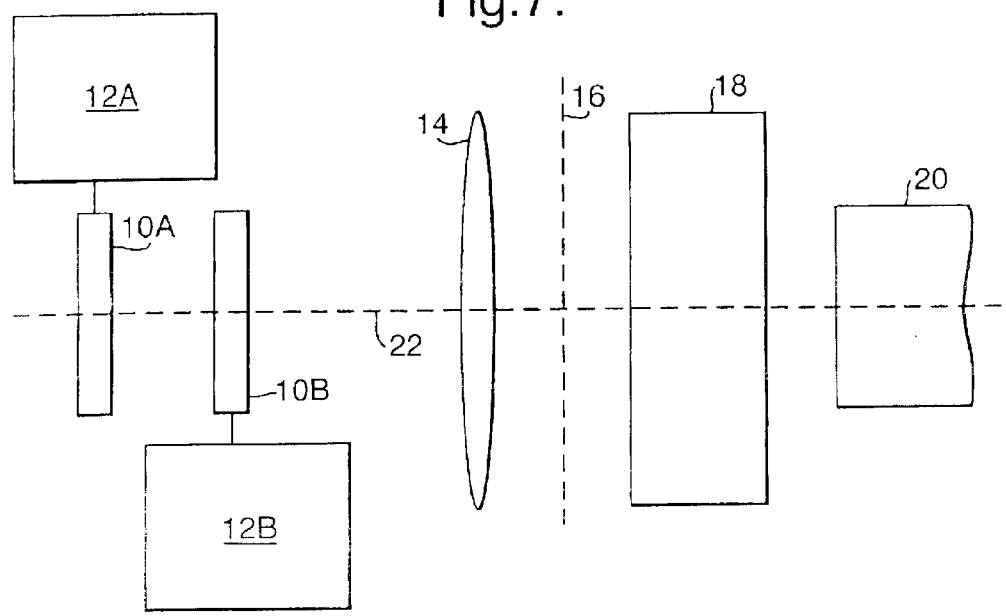
FIG. 7 illustrates a further embodiment of an illuminator according to the present invention.

A further embodiment of the invention is illustrated in FIG. 7. In this example two optical elements 10A, 10B are disposed in series along the beam path and each optical element has a respective exchanger 12A, 12B. Each of the exchangers in this example is provided with a set of optical elements for controlling a particular sub-set of characteristics or parameters of the intensity distribution. For example, the optical elements associated with exchanger 12A may define a number of annular settings (σ-inner and σ-outer) taking over the function of an axicon, i.e. controlling the annularity of the intensity distribution, while the optical elements associated with exchanger 12B may define a number of conventional settings defining the radial extent of the spatial intensity distribution pattern at the pupil (σ-outer), as conventionally controlled by a zoom module. Each exchanger 12A, 12B features an empty slot and can independently swap between different optical elements, which define said different values of the particular parameter or characteristic of the beam that it is creating. The combined effect of an annular setting by exchanger 12A and a conventional setting by exchanger 12B will be a convolution of the corresponding intensity distributions in the pupil plane. Thus, the σ-inner and σ-outer values as set with exchanger 12A will respectively be lowered and increased (i.e., the ring width of the annulus will increase) when combined with a conventional setting by means of the optical element in exchanger 12B. In this way, great flexibility can be achieved, and fewer optical elements required, because different combinations of the optical elements in series are possible.

While specific embodiments of the invention have been described above, it will be appreciated that the invention may be practiced otherwise than as described. The description is not intended to limit the invention.

What is claimed is:

1. A lithographic projection apparatus comprising:
   a radiation system to provide a beam of radiation, comprising an illumination system that defines an intensity distribution of the beam at a plane, the illumination system comprising adjusting structure to control an angular intensity of the intensity distribution such that at least one localized portion of the intensity distribution has a higher intensity than at least another localized portion of the intensity distribution;
   patterning structure that patterns the beam according to a desired pattern;
   a substrate table to hold a substrate; and
   a projection system to project the patterned beam onto a target portion of the substrate;
   the adjusting structure comprising at least one exchanger for inserting and removing at least one of a plurality of optical elements into and out of the beam path, each of the said optical elements defining a particular intensity distribution, and the adjusting structure being configured to provide at least one hybrid illumination pattern in said plane by moving the at least one of the plurality of optical elements substantially perpendicularly to said beam path.

2. An apparatus according to claim 1, wherein at least one optical element comprises an optical element selected from the group consisting of microlens arrays, microprism arrays, holograms and arrays of holograms.

3. An apparatus according to claim 1, wherein the position along the beam path of at least one optical element is adjustable.

4. An apparatus according to claim 1, wherein the hybrid illumination pattern comprises a combination of two or more patterns selected from the group consisting of conventional, quadrupole, dipole wherein an axis through a center of each pole is parallel to an X-axis, dipole wherein an axis through the center of each pole is parallel to a Y-axis, dipole arrayed along an arbitrary axis and annular.

5. An apparatus according to claim 4, wherein the combination of patterns comprises a selected percentage of each pattern.

6. An apparatus according to claim 5, wherein the selected percentage is selected by moving at least a portion of the adjusting structure.

7. An apparatus according to claim 1, wherein at least one of the plurality of optical elements comprises an array of optical elements including a first type and a second type of optical element, the first type corresponding to a first illumination mode and the second type corresponding to a second illumination mode.

8. An apparatus according to claim 7 wherein the optical elements comprise Fresnel lenses.

9. An apparatus according to claim 8 wherein the optical elements comprise holograms.

10. An apparatus according to claim 1, wherein at least two of said optical elements are arrangeable in parallel in said beam path.

11. An apparatus according to claim 10, wherein a proportion in said beam path of each of said optical elements arrangeable in parallel in said beam path is adjustable.

12. An apparatus according to claim 1, wherein at least two of said optical elements are arrangeable in series along said beam path.

13. An apparatus according to claim 1, wherein said parameters of said intensity distribution are selected from:
   outer radial extent, annularity, inner radial extent, perimetric form, perimetric orientation, number of poles, orientation of poles, pole size, pole shape, intensity gradient, and background illumination.

14. A device manufacturing method comprising:
   operating an exchanger to place at least one optical element in a path of a beam of radiation within an illumination system of a lithographic projection apparatus;
   moving said at least one optical element substantially perpendicularly to said path to produce at least one hybrid illumination pattern in the beam of radiation;
   further patterning the beam according to a pattern comprising at least a portion of a layer of the device; and
   projecting the patterned beam of radiation onto a target area of a layer of radiation-sensitive material on a substrate.

15. A device manufacturing method according to claim 14, wherein the moving comprises moving said at least one optical element substantially perpendicularly to said path to produce a plurality of hybrid illumination patterns.

16. A device manufacturing method according to claim 15, wherein one of the plurality of hybrid illumination patterns comprises a selected percentage of at least two of the remaining hybrid illumination patterns.

17. An apparatus according to claim 1, wherein said at least one hybrid illumination pattern comprises a plurality of hybrid illumination patterns.

18. An apparatus according to claim 17, wherein one of the plurality of hybrid illumination patterns includes a selected percentage of at least two of the remaining of the plurality hybrid illumination patterns.

19. A lithographic projection apparatus comprising:

a radiation system to provide a beam of radiation, comprising an illumination system that defines an intensity distribution of the beam at a plane, the illumination system comprising adjusting structure to control an angular intensity of the intensity distribution such that at least one localized portion of the intensity distribution has a higher intensity than at least another localized portion of the intensity distribution;

patterning structure that patterns the beam according to a desired pattern;

a substrate table to hold a substrate; and a projection system to project the patterned beam onto a target portion of the substrate;

the adjusting structure comprising at least one exchanger for inserting and removing a plurality of optical elements into and out of the beam path, each of the said optical elements defining a particular intensity distribution, and the adjusting structure being configured to provide hybrid illumination patterns in said plane by moving at least two of the plurality of optical elements substantially perpendicularly to said beam path.

20. An apparatus according to claim 19, wherein each of the hybrid illumination patterns corresponds to a selected percentage of a first illumination pattern created by one of the at least two optical elements and a second illumination pattern created by the other one of the at least two optical elements.

* * * * *